United States Patent [19]

Wanek et al.

[11] Patent Number: 4,664,892

[45] Date of Patent: May 12, 1987

[54] BIOMEDICAL SILVER-109M ISOTOPE GENERATOR

[75] Inventors: Philip M. Wanek; Frederick J. Steinkruger; David C. Moody, all of Los Alamos, N. Mex.

[73] Assignee: The United States of America as represented by the United States Department of Energy, Washington, D.C.

[21] Appl. No.: 708,625

[22] Filed: Mar. 5, 1985

[51] Int. Cl.$^4$ ........................ C09K 11/00; H01L 25/00

[52] U.S. Cl. ................................ 423/2; 250/432 PD; 422/159; 252/645

[58] Field of Search ........................ 252/645; 422/159; 250/432 PD; 423/2, 6

[56] References Cited

U.S. PATENT DOCUMENTS

| | | | |
|---|---|---|---|
| 4,472,299 | 9/1984 | Weisner et al. | 252/645 |
| 4,597,951 | 7/1986 | Gennaro et al. | 252/645 |

FOREIGN PATENT DOCUMENTS

| | | | |
|---|---|---|---|
| 0043650 | 1/1982 | European Pat. Off. | 252/645 |

OTHER PUBLICATIONS

F. J. Steinkruger, G. E. Bentley, H. A. O'Brien, Jr., M. A. Ott, F. H. Seurer, W. A. Taylor, and J. W. Barnes, "Production and Recovery of Large Quantities of Radionuclides for Nuclear Medicine Generator Systems", in Radionuclide Generators: New Systems for Nuclear Medicine Applications, Furn F. Knapp, Jr. and Thomas A. Butler, Ed., Amer. Chem. Soc., Washington, Mar. 20-25, 1983, pp. 179-184.

Yukio Yano and Hal O. Anger, "Ultrashort-Lived Radioiosotopes for Visualizing Blood Vessels and Organs", J. Nucl. Med. 9, No. 1, 2-6 (1968).

Gary J. Ehrhardt, Maoliang Li, William F. Goeckeler, and Steven Benner, "A New Cd-109/Ag-109m Generator System", in Proceeding of Internatinal Symposium on Single Photon Ultrashort-Lived Radionuclides, conf. 830504, in press.

A. E. Ogard, "Preliminaries to a CD-Ag Generator System", in Proceedings Joint Amer. Chem. Soc./-Chem. Soc. Japan Chem. Cong., Honolulu, Apr. 1979.

*Primary Examiner*—John F. Terapane
*Assistant Examiner*—T. J. Wallen
*Attorney, Agent, or Firm*—William A. Eklund; Ray G. Wilson; Judson R. Hightower

[57] ABSTRACT

A method, composition of matter, and apparatus for producing substantially pure Ag-109m for use in biomedical imaging techniques. Cd-109, which decays with a half-life of 453 days to Ag-109m is loaded onto an ion exchange column consisting of particulate tin phosphate. After secular equilibrium is reached in about ten minutes, Ag-109m may be selectively eluted from the column by means of a physiologically acceptable aqueous buffered eluent solution of sodium thiosulfate, and either ascorbic acid or dextrose. The breakthrough of toxic Cd-109 is on the order of $1\times10^{-7}$, which is sufficiently low to permit administration of the Ag-109m-containing eluate, with but a minor pH adjustment, directly to a human patient within a matter of seconds.

10 Claims, 1 Drawing Figure

BIOMEDICAL SILVER-109M ISOTOPE GENERATOR

This invention is the result of a contract with the Department of Energy (Contract No. W-7405-ENG-36).

BACKGROUND OF THE INVENTION

The invention disclosed herein is generally related to methods, apparatus and compositions of matter for producing radioisotopes useful in medical diagnostic techniques. More particularly, the present invention is related to methods, apparatus and compositions of matter for the production of short-lived radioisotopes, particularly silver-109m, for use in biomedical imaging techniques.

In certain biomedical imaging techniques a radioactive isotope is introduced into an organ, circulatory system, or other portion of a living subject, and is allowed to undergo natural distribution within the subject. The location and concentration of the isotope within the subject can be monitored, using various types of radiation detectors, to give an image of the distribution of the isotope within the subject, thus giving rise to various useful medical diagnostic applications. As an example of an application for which the present invention is particularly useful, and as discussed further below, an isotope which emits gamma rays, and which is restricted to the alimentary canal upon oral ingestion, may be monitored by means of a gamma camera to provide a pictorial image of the alimentary canal of a living subject. Gastric functions in the alimentary canal may also be monitored using the pictorial images obtained by such a technique.

When such techniques are applied to human patients, it is particularly desirable to use an isotope which has a relatively short half-life, so that, while the isotope is sufficiently long-lived to permit an image to be obtained, the gamma irradiation incurred by the patient thereafter is minimized. It is also generally desirable that the isotope nd its decay products be relatively non-toxic.

One isotope which is useful in such a method is the metastable isotope of silver-109 (silver-109m, hereinafter referred to as Ag-109m). Ag-109m decays by isomeric transition to stable silver-109 (Ag-109). This decay is characterized by a half-life of 39.6 seconds and the emission of an 88 keV gamma ray which can be readily detected using conventional gamma cameras. The advantages of using Ag-109m in medical applications are that: it has a very short half-life; both the excited Ag-109m and its decay product Ag-109 are chemically identical and relatively non-toxic at the concentrations required; and the gamma photon is well defined and readily detectable.

Until now, however, the short (39.6 second) half-life of Ag-109m has seriously limited its use in biomedical imaging techniques, as there has been no way to prepare substantially pure Ag-109m and administer it to a subject before most of the isotope has decayed.

Ag-109m is most readily produced by decay of cadmium-109 (Cd-109), which decays to Ag-109m with a half-life of 453 days. Cd-109 may be produced in relatively large quantities by irradiation of an indium metal target with 800 MeV protons for about 60 days. The yield as a consequence of proton-induced spallation from a 100 g indium target is approximately 1.5 curies of Cd-109 (which has a specific activity of approximately 100 curies/g), of which approximately 92% may be recovered using known ion exchange procedures. Briefly, the irradiated indium target is dissolved in acid solution and the Cd-109 is selectively removed by ion exchange processes as a chloride complex in 12 molar HCl solution. These procedures are set forth in detail in the paper entitled "Production and Recovery of Large Quantities of Radionuclides for Nuclear Medicine Generator Systems," by F. J. Steinkruger et al., which is published in "Radionuclide Generators," F. F. Knapp, Jr., and T. A. Butler, eds., American Chemical Society, Seattle, Wash., p. 179, 1984, which is hereby incorporated by reference.

The 88 keV gamma radiation from Ag-109m is characterized by a large internal conversion fraction and a resultant low intensity of approximately 3.7 percent. Consequently, in biological imaging techniques it is necessary to use a fairly large amount of Ag-109m, which in turn requires the use of a relatively large amount of the source isotope Cd-109, on the order of one Curie.

Cadmium and silver have been separated previously by conventional ion exchange separation techniques. These techniques could ordinarily be used to efficiently separate isotopes of cadmium from isotopes of silver. However, the high amount of Cd-109 required for the generation of sufficient Ag-109m results in radiation levels which are sufficiently high to cause radiation damage in ordinary organic resins of the type commonly used in chromatographic and other ion exchange techniques. Hence, it has been sought to discover an inorganic, radiation-resistant ion exchange substrate which is useful for efficient and rapid separation of silver from cadmium. Moreover, in view of the very short half-life of the Ag-109m it has been further sought to provide a non-toxic eluent solution which is effective for conducting the Cd-109/Ag-109m separation process and which can also be used with little or no modification as a carrier vehicle to immediately introduce the eluted Ag-109m into a human patient.

Previous research efforts have been directed to this problem, but have attained only limited success. For example, inorganic alumina ($Al_2O_3$) has been used as an ion exchange substrate for Cd-109/Ag-109m separation; however, the breakthrough of the toxic cadmium was too high to permit introduction of the eluate into a human subject. (Breakthrough is defined as the ratio of the amount of cadmium in the eluate solution to the total amount of cadmium initially absorbed on the ion exchange column.) This research is reported in A. E. Ogard, "Preliminaries to a $^{109}$Cd-$^{109m}$Ag Generator System", in Proceedings Joint Amer. Chem. Soc./-Chem. Soc. Japan Chem. Cong., Honolulu, April, 1979; and Y. Yano and H. O. Anger, "Ultrashort-Lived Radioisotopes for Visualizing Blood Vessels and Organs", J. Nucl. Med., V. 9, p. 2–6, 1968. In both of these methods using alumina, cadmium breakthrough levels at least as high as $2\times10^{-4}$ are reported. In view of the high toxicity of cadmium and the 20–40 year residence time half-life of cadmium in the human body, these methods are considered unacceptable for use in human patients.

Zirconium phosphate has also been used as an ion exchange substrate for separating Cd-109 from Ag-109m. This work is reported in G. J. Ehrhardt et al., "New Cd-109/Ag-109m Generator System", in Proceedings of International Symposium on Single Photon Ultrashort-Lived Radionuclides, Conf. 830504, in press. A cadmium breakthrough of $3\times10^{-6}$ was reported. A second, or cleanup column was required to reduce the breakthrough below $10^{-7}$, which necessarily introduces a significant delay into the administration of the Ag-109m to a patient by such a method.

SUMMARY OF THE INVENTION

Accordingly, it is the object and purpose of the present invention to provide means for rapidly and efficiently producing Ag-109m for use in biomedical applications.

More specifically, it is an object of the invention to provide means for producing Ag-109m in a form which is sufficiently free of cadmium to permit its introduction into a human patient without further extraction of cadmium.

It is also an object of the present invention to provide means for producing Ag-109m in an aqueous solution which is physiologically acceptable to a human patient.

In accordance with the present invention, a biomedical generator for Ag-109m comprises an ion exchange column including Cd-109 adsorbed onto a substrate of particulate tin phosphate. Tin phosphate has been determined to constitute an ion exchange substrate from which Ag-109m can be selectively and consistently eluted with yields of at least 48% and with a cadmium breakthrough of approximately $10^{-7}$. Further, tin phosphate does not suffer from radiation damage over the period of time the Cd-109 is active, which is up to several years.

The present invention also includes the composition of matter used for the foregoing purpose, comprising an effective amount of cadmium-109 adsorbed onto an ion exchange substrate consisting essentially of particulate tin phosphate.

The invention also lies in the method of producing Ag-109m for use in biomedical applications, comprising the steps of loading an acidic aqueous solution of Cd-109 onto an ion exchange substrate consisting essentially of particulate tin phosphate, allowing secular equilibrium to be attained, and selectively eluting Ag-109m from said substrate with an eluent solution. A preferred eluent comprises an aqueous solution of ascorbic acid and sodium thiosulfate, buffered with a disodium hydrogen phosphate/sodium dihydrogen phosphate buffer. An alternative eluent solution includes dextrose and sodium thiosulfate, and is buffered with McIlvaine's buffer (a citric acid/phosphate buffer).

These and other aspects of the invention are set forth more completely in the following detailed description of the invention.

BRIEF DESCRIPTION OF THE DRAWINGS

The accompanying drawing, which is incorporated in and forms part of the specification, is a graphical representation of data obtained in a demonstration of the present invention. In the drawing.

DETAILED DESCRIPTION OF THE INVENTION

Figure 1:
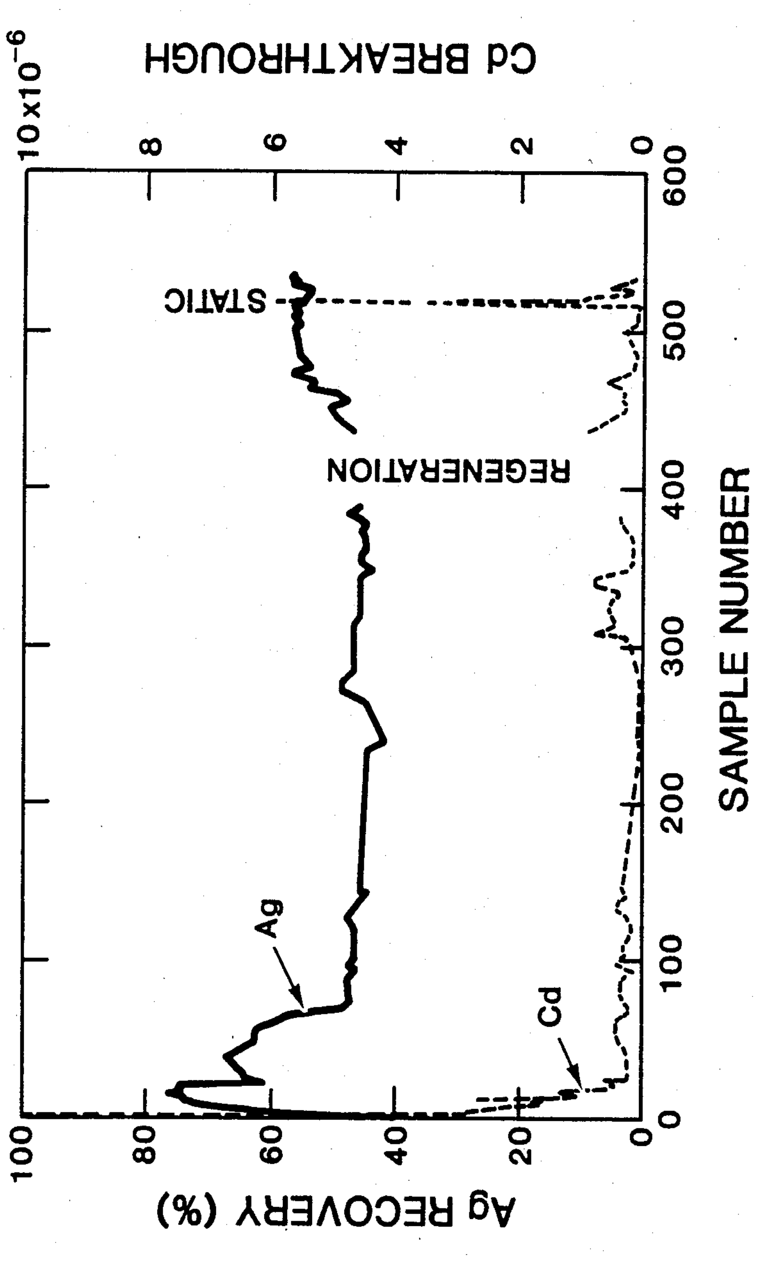
FIG. 1 is a plot of both the yield of Ag-109m and the cadmium breakthrough as a function of the number of elutions taken from a Cd-109-loaded tin phosphate ion exchange column.

Cadmium-109 may be prepared by any suitable method, although the method of production by proton-induced spallation of indium, referenced above, is considered the most practical technique available.

In accordance with a preferred embodiment of the invention, a strong acid solution of Cd-109 is evaporated to incipient dryness. Water is added and the solution is dried, this step being repeated twice. Water is then added in an amount such that the final solution contains approximately several hundred millicuries of Cd-109 in less than 0.9 milliliter of solution. Of this final solution, 50 microliters, containing up to 15 millicuries of Cd-109, are loaded onto 1.5 milliliters of pretreated tin phosphate in a conventional ion exchange column tube. After the Cd-109 is loaded, the fluid level is drained into the column bed and followed with two drops of water to prevent drying. The column is allowed to remain static for seven days.

The tin phosphate pretreatment consists of grinding and sieving commercially available granular tin phosphate to a mesh size of −80 to +115. The ground tin phosphate is washed with water to remove fine particles, then washed with 0.1 molar phosphate buffer having a pH of 7.4 until the eluate attains a pH of 7.4. A 1.5 ml column is then poured and allowed to stand overnight, at which time the pH is again tested to establish stability of the buffer. Immediately before loading of the Cd-109 solution onto the column, the column is washed with two column volumes of distilled water under gravity flow.

Once loaded, the column continually produces Ag-109m over a period of several years. Within several Ag-109m half-lives after the initial loading, most of the silver in the column exists as stable Ag-109, since the Ag-109m decays to Ag-109 within a few minutes after being produced. Approximately 10 minutes after loading, secular equilibrium is attained, resulting in a steady-state concentration of Ag-109m in the column, which with time becomes a progressively decreasing fraction of the total amount of silver in the column.

The Ag-109m (as well as any accumulated Ag-109) may be selectively eluted from the column. Because of the short half-life of the Ag-109m, however, it is desirable to elute the Ag-109m with an eluent which is physiologically acceptable to a living subject, so that the eluate and the Ag-109m dissolved therein may be transferred, with little or no modification, and within a few seconds, to a living subject.

The eluent composition was determined with the goal of maintaining isotonicity and physiological pH, so as to be biologically inert, while also maximizing the yield of Ag-109m and minimizing the breakthrough of Cd-109. Two eluent solutions, the first employing ascorbic acid as a reducing agent and the second employing dextrose as a reducing agent, have been found satisfactory for the practice of the invention. Reduction of $Ag^{+1}$ to $Ag^0$ is achieved in the eluent solution by the ascorbic acid or the dextrose, respectively. Each eluent solution also includes thiosulfate, preferably as sodium thiosulfate, which is employed as a complexing agent to facilitate the reduction of the $Ag^{+1}$ by formation of the $Ag(S_2O_3)_2^{-3}$ complex.

The ascorbic acid-based eluent may be formed by combining 5.0 g of ascorbic acid, 2.0 ml of a 0.01M solution of sodium thiosulfate ($Na_2S_2O_3$), 5.0 ml of a 7.4 pH phosphate buffer solution, and diluting the resulting mixture with water to give 100 ml of eluent solution. In this regard, the 7.4 pH phosphate buffer solution may be made, for example, by combining 100 ml of a first solution consisting of 2.77 g of disodium phosphate (Na₂H-

$PO_4.7H_2O$) in 100 ml of $H_2O$, and 15 ml of a second solution consisting of 2.14 g of sodium dihydrogenphosphate ($NaH_2PO_4.H_2O$) dissolved in 100 ml of water.

The second eluent solution, which is useful under certain circumstances described below, may be made by mixing together 5.0 ml of a pH 3.8 McIlvaine's buffer solution, 2.0 ml of 0.01M sodium thiosulfate solution, 5.0 g dextrose, and diluting the resulting solution to 100 ml. The pH 3.8 McIlvaine's buffer solution may be made by mixing together 12.9 ml of a first solution consisting of 0.1M citric acid, and 7.1 ml of a second solution consisting of 0.2M disodium phosphate.

For reasons which are not altogether clear, the yield of Ag-109m from the column tends to decrease initially and then levels off with successive elutions of the column (yield is defined as the ratio of the amount of Ag-109m obtained in any single elution to the amount present in the column prior to the elution). See FIG. 1 in this regard. Using the preferred ascorbic-acid-based eluent solution described above, after the first few elutions the yield drops from approximately 75% to 48% over 50 to 100 elutions, then assumes a relatively constant yield of about 48% for at least several hundred elutions thereafter. After a stable 48% yield is obtained, the pH of the eluate stabilizes at approximately 2.6, and the cadmium breakthrough stabilizes at an average of approximately $2\times10^{-7}$. It is reasonable to assume that the system will retain these stable parameters over long periods of time, limited only by the 453 day half-life of the Cd-109.

It has also been found that the column may be regenerated to increase the Ag-109m yield somewhat by washing the column with a dilute basic solution, for example 0.05M NaOH. Such washing, when coupled with subsequent elutions using the dextrose-based eluent, typically increases the yield to approximately 56%. Under these conditions the Cd-109 breakthrough rises temporarily and then decreases to a constant level of approximately $2\times10^{-7}$. For reasons which are as yet unknown, the higher efficiency of the dextrose-based eluent depends on the previous elution of the column with the ascorbic acid-based eluent and the NaOH regeneration.

EXAMPLE

In an exemplary demonstration of the invention, a Cd-109 source was first prepared at the Isotope Production Facility at the Los Alamos National Laboratory, Los Alamos, N.M., 105.8 g of indium metal was melted into a stainless steel tube 1.9 cm in diameter and 7.6 cm high. The tube was welded shut, placed in a target carrier, and positioned in a target area of a large linear atomic particle accelerator known as the Los Alamos Meson Physics Facility. The indium target was irradiated with 800-MeV protons for 55.8 days to produce Cd-109 and other nuclides by proton-induced spallation of the indium. The amount of Cd-109 produced in the target was approximately 1.553 Curies. The indium target was then dissolved in hot 6M HCl, filtered to remove an insoluble antimony impurity, diluted to 3M HCl, and loaded onto an AG-1X8 anion exchange column. The column was eluted with 3M HCl to remove the indium isotopes, then eluted with 8M HCl to remove rhenium and certain other isotopes produced in the target. The column was then eluted with 12M HCl to recover the Cd-109. This procedure yielded approximately 1.427 Curie of Cd-109, or 92% of the amount originally produced. Further details regarding this procedure are set forth in the above-referenced paper entitled "Production and Recovery of Large Quantities of Radionuclides for Nuclear Medicine Generator Systems" by Steinkruger et al.

The acidic solution of Cd-109 (as cadmium chloride) produced by the above process was then evaporated to incipient dryness, redissolved in water twice, and taken up in 200 microliters of distilled water. 50 microliters of this solution was assayed for Cd-109 content. Another 50 microliter aliquot, containing approximately 15 millicurie of Cd-109, was loaded onto 1.5 ml of a tin phosphate ion exchange bed which was pretreated as described above, followed by 100 microliters of distilled water. The column was capped and allowed to stand for seven days.

The column was then eluted, first using the ascorbic-acid-based eluent described above. The results are presented in FIG. 1. In FIG. 1 the sample numbers represent successive elutions. The standard elution procedure was to draw a 1.5 ml sample in approximately 7 seconds. At least 10 minutes was allowed between successive elutions to permit secular equilibrium to be attained.

As shown in FIG. 1, in the first few elutions the cadmium breakthrough is relatively high and the Ag-109m yield is low, although the Ag-109m yield quickly attains a maximum of about 75%. Furher, over the first 50 to 100 elutions the Ag-109m yield decreases from approximately 75% to 40% and the cadmium breakthrough drops to approximately $10^{-7}$. During this same series of elutions the pH of the eluate decreased from approximately 4.2 to 2.6. Thereafter, stability is attained, with the Ag-109m yield remaining at approximately 48%, cadmium breakthrough on the order of $1\times10^{-7}$, and pH of 2.6. The fluctuations in Cd breakthrough at samples 300 to 350 are an artifact which resulted from the testing of several different reducing agents which are not discussed here. From these data, it will be apparent that in the practical use of the column it will ordinarily be sought to first obtain stability by subjecting the column to approximately a hundred elutions prior to actual medical use.

Still referring to FIG. 1, after sample number 386 the column was regenerated by washing with a total volume of 200 ml of 0.05M NaOH solution. The column was subsequently eluted with the dextrose-based eluent described above. As shown, the Ag-109m yield increased to approximately 56% while the Cd breakthrough remained in the $10^{-7}$ range.

At sample 520 the column was left in a static condition for three months under a 5% McIlvaine's buffer. After this period elution was resumed with the dextrose-based eluent. The Ag-109m yield immediately resumed a steady value of about 56%. After a brief initial increase in Cd breakthrough in the first few elutions, the Cd breakthrough also returned to its previous low levels.

FIG. 1 also indicates the long term stability of the generator in terms of Ag-109m yield and Cd breakthrough, inasmuch as the 527 1.5 ml elutions were taken over a period of six months.

The foregoing description of the preferred embodiments of the invention has been presented for purposes of illustration and description. It is not intended to be exhaustive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What we claim is:

1. A method of producing substantially pure silver-109m for use in biomedical techniques, comprising the steps of:

a. loading an aqueous solution of cadmium-109 onto an ion exchange substrate consisting essentially of tin phosphate;

b. allowing secular equilibrium to be attained; and c. selectively eluting silver-109m from said column with an eluent solution to produce an eluate solution which contains said silver-109m and which is sufficiently free of cadmium to permit administration to a human patient.

2. The method defined in claim 1 wherein said eluent solution comprises a disodium hydrogen phosphate/-sodium dihydrogen phosphate buffer, a reducing agent, and sodium thiosulfate.

3. The method defined in claim 2 wherein said reducing agent consists essentially of ascorbic acid.

4. The method of claim 1 wherein said eluent solution comprises McIlvaine's buffer, sodium thiosulfate and a reducing agent consisting essentially of dextrose.

5. A composition of matter for generating silver-109m for biomedical applications, comprising an effective amount of cadmium-109 adsorbed onto an ion exchange substrate consisting essentially of particulate tin phosphate.

6. The composition defined in claim 5 wherein said cadmium-109 is absorbed as an aqueous solution of cadmium-109 chloride.

7. The composition defined in claim 5 wherein said particulate tin phosphate is of a grain size of between −80 and +115 mesh.

8. An apparatus for generating silver-109m for biomedical applications, comprising an ion exchange column containing particulate tin phosphate, said ion exchange column being loaded with an aqueous solution of cadmium-109.

9. The apparatus defined in claim 8 wherein said tin phosphate is of a mesh size of between approximately −80 and +115.

10. The apparatus defined in claim 9 wherein said cadmium-109 is loaded onto said tin phosphate as an acidic solution of cadmium-109 chloride.

* * * * *